(12) United States Patent
Du

(10) Patent No.: US 11,519,095 B2
(45) Date of Patent: Dec. 6, 2022

(54) MBE SYSTEM WITH DIRECT EVAPORATION PUMP TO COLD PANEL

(71) Applicant: Peng Du, Beijing (CN)

(72) Inventor: Peng Du, Beijing (CN)

( * ) Notice: Subject to any disclaimer, the term of this patent is extended or adjusted under 35 U.S.C. 154(b) by 0 days.

(21) Appl. No.: 16/758,622

(22) PCT Filed: Apr. 22, 2019

(86) PCT No.: PCT/CN2019/083736
§ 371 (c)(1),
(2) Date: Apr. 23, 2020

(87) PCT Pub. No.: WO2020/215189
PCT Pub. Date: Oct. 29, 2020

(65) Prior Publication Data
US 2022/0049371 A1   Feb. 17, 2022

(51) Int. Cl.
*C30B 23/00*     (2006.01)
*B01D 8/00*      (2006.01)
(Continued)

(52) U.S. Cl.
CPC .............. *C30B 23/005* (2013.01); *B01D 8/00* (2013.01); *C23C 14/0617* (2013.01);
(Continued)

(58) Field of Classification Search
CPC ..... C30B 23/00; C30B 23/002; C30B 23/005; C30B 23/02; C30B 29/00; C30B 29/10;
(Continued)

(56) References Cited

U.S. PATENT DOCUMENTS 4,137,865 A * 2/1979 Cho ....................... C23C 14/541
118/724
2004/0020219 A1   2/2004 Colombo et al.
(Continued)

FOREIGN PATENT DOCUMENTS

CN        1591783 A      3/2005
CN        102803579 A    11/2012
(Continued)

OTHER PUBLICATIONS

Int'l Search Report dated Jan. 15, 2020 in Int'l Application No. PCT/CN2019/083736.

*Primary Examiner* — Kenneth A Bratland, Jr.
(74) *Attorney, Agent, or Firm* — Panitch Schwarze Belisario & Nadel LLP

(57) ABSTRACT

An MBE system is disclosed for eliminating the excess flux in an MBE growth chamber before growth, during growth or growth interruption, and/or after growth by evaporating getter material from an effusion evaporator to the cold panel. The cold panel can be the cryopanel of the MBE growth chamber or a cold panel in an attached chamber. Said MBE system includes the cyropanel in the MBE growth chamber or a cold panel in the chamber attached to the MBE growth chamber. With a proper process such as cooling the cold panel, loading a substrate for the MBE process, providing necessary flux for the MBE growth, heating the effusion evaporator and opening the shutter for the evaporator to get the getter material flux onto the said panel, the excess flux will be eliminated. The cross contamination of the grown layer is then avoided.

8 Claims, 3 Drawing Sheets

(51) Int. Cl.
*C23C 14/06* (2006.01)
*C23C 14/28* (2006.01)
*C30B 23/02* (2006.01)
*C30B 29/40* (2006.01)
*H01L 21/02* (2006.01)

(52) U.S. Cl.
CPC .............. *C23C 14/28* (2013.01); *C30B 23/02* (2013.01); *C30B 29/40* (2013.01); *H01L 21/02631* (2013.01)

(58) Field of Classification Search
CPC ....... C30B 29/40; C30B 35/00; C30B 35/002; B01D 8/00; C23C 14/0617; C23C 14/28; H01L 21/02631
USPC ........... 117/84, 88, 103, 108, 200–201, 204; 118/715, 722, 723 R, 723 EB, 726
See application file for complete search history.

(56) References Cited

U.S. PATENT DOCUMENTS

| | | | |
|---|---|---|---|
| 2005/0045091 A1 | 3/2005 | Kawasaki | |
| 2005/0227005 A1* | 10/2005 | Cheong | C23C 14/564 |
| | | | 427/248.1 |
| 2005/0229856 A1 | 10/2005 | Malik | |
| 2006/0011609 A1* | 1/2006 | Pfeiffer | C23C 14/243 |
| | | | 219/442 |
| 2006/0185599 A1* | 8/2006 | Bichrt | C23C 14/243 |
| | | | 118/726 |

FOREIGN PATENT DOCUMENTS

| | | | |
|---|---|---|---|
| CN | 102803580 A | | 11/2012 |
| JP | H0426588 A | | 1/1992 |
| JP | 2000226296 A | * | 8/2000 |
| JP | 2000226296 A | | 8/2000 |

* cited by examiner

MBE SYSTEM WITH DIRECT EVAPORATION PUMP TO COLD PANEL

CROSS-REFERENCE TO RELATED APPLICATION

This application is a Section 371 of International Application No. PCT/CN2019/083736, filed Apr. 22, 2019, which has not yet published, the disclosure of which is incorporated herein by reference.

TECHNICAL FIELD

The present application relates to an MBE system for eliminating the excess flux in a Molecular Beam Epitaxy (MBE) growth chamber before growth, during growth or growth interruption, and/or after growth. The MBE system is for the epitaxial growth of III-V, II-V, Si/Ge semiconductor system, oxide material and other compound semiconductors.

BACKGROUND

The molecular beam epitaxy system normally has an ultra-high vacuum (UHV) growth chamber, effusion cells to supply molecular or atomic beams, and pumps to maintain the UHV environment in the chamber. The ultra-high vacuum (UHV) environment in the chamber is critical to ensure that the mean free path of the molecular is larger than the size of the chamber so that there is no collision before the evaporated atom/molecular reaching the substrate.

In the normal growth condition of a solid source MBE system for epitaxial growth of a compound material, one or two molecular elements are supplied much more than others, such as arsenic in a GaAs system, Antimony in a GaSb system, Phosphorus in an InP system, Nitrogen in a GaN system, Hg in an MCT system and oxygen in an oxide system. The excess flux supplied can't be incorporated into the grown layer and thus forms a residual gas in the growth chamber. Cryopanel and pumps are supposed to pump these residual gases. However, both practice and theory calculation show that there are still residual gases in the growth chamber during growth that can't be pumped by the cryopanel and the pumps. For example, the background arsenic pressure in the growth chamber during growth of GaAs can be as high as 1E-7 torr level if the arsenic flux for growth is at 1E-5 torr level. This residual gas could be of no harm for the binary compound growth such as GaAs. However, it generates contamination if the growth is carrying out for ternary compound, quaternary compound or pentanary compound such as InAsP, InAsPSb, InGaAlAsPSb, etc. because the incorporation rate of the elements As, Sb and P is quite sensitive to the partial pressure. Or, in a system, the excess elements need to be switched between layers such as InAs/GaSb superlattice, CdTe/HgTe superlattice and silicon/oxide system. Then, the content of the structure grown is not as stable as expected.

Conventional pumps such as Ion pump, turbo pump and cryopump have different difficulties to pump the residual gas in short time and constantly when there is a gas load or when supplying excess molecular flux. The ion pump could reach its lifetime quite fast if the gas load is too high. The cryopump will be saturated quite fast and the turbo pump will have a back steam problem. The cryopanel was designed for reducing the back ground pressure during growth. But, the pumping efficiency is not high enough. For example, at 100K, there will still be at least 15% arsenic desorbing from the As excess surface of the cryopanel. Due to the heat load to the cyropanel from cells or a manipulator and the low thermal conductivity of stainless steel, the surface temperature of cyropanel can be dramatically higher than 77K. The pumping speed of the cyropanel is further limited. On the other hand, the residual arsenic plays an important role in the ongoing growth. For example, the arsenic contamination is quite clear and damaging the structure quality of the GaSb layer in InAs/GaSb system. To grow InGaAsP contained structure, the As/P beam is hard to control and changeover.

SUMMARY

The object of the present application is to provide an MBE system with a direct evaporation pump that can get the excess flux or residual gas to be pumped more efficiently.

The object of the application is achieved by the following principle. A non-contamination getter material will be evaporated from an effusion evaporator to the cryopanel or another cold panel to increase the sticking efficiency of the excess flux. The getter material is the element that can increase the sticking efficiency of the molecular to be eliminated on the cold surface if there is already a getter material on the surface. The getter material will not provide additional contamination to the grown layer and the flux of the getter material will not compromise the flux supplied by the sources for layer growth. Thus, the excess flux or residual gas in the MBE growth chamber is eliminated.

DETAILED DESCRIPTION

Figure 1:
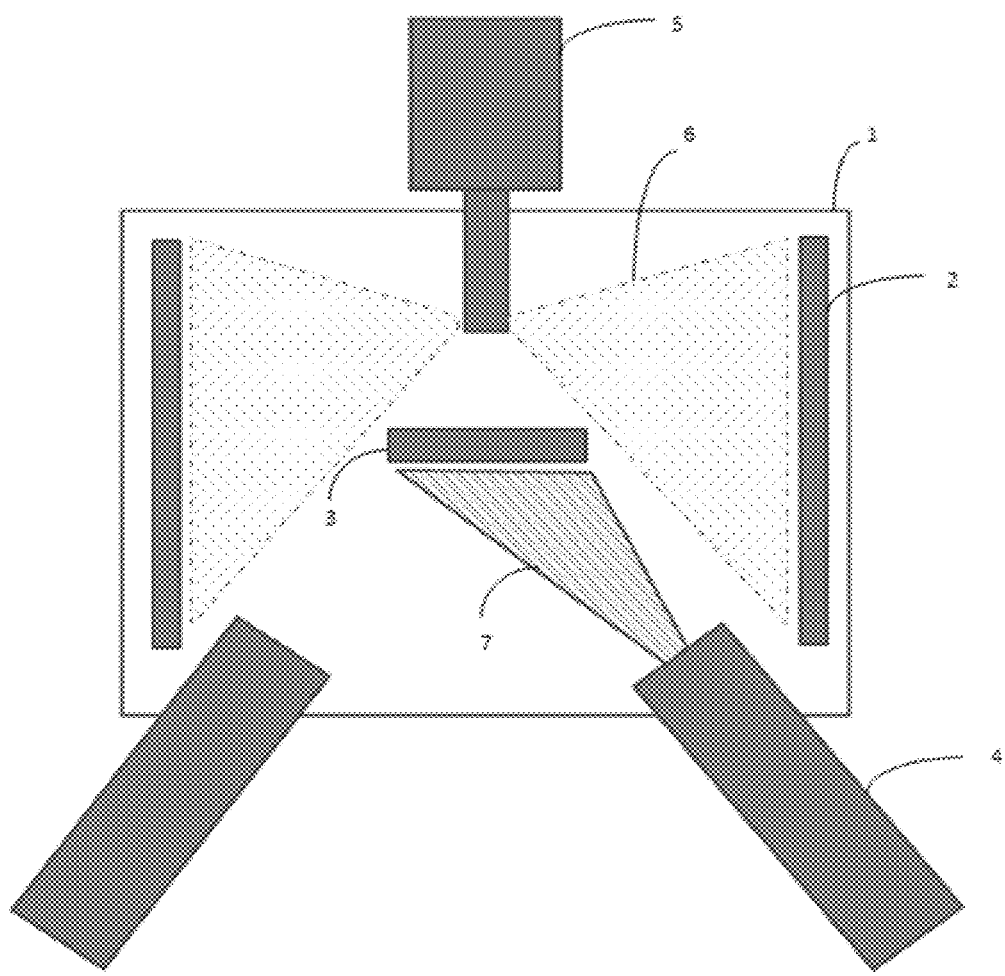
FIG. 1 is a schematic view of one setup of the present application for an MBE system where the effusion evaporator is mounted on top of the chamber and working with the cyropanel of the MBE growth chamber. The flux provided by the evaporator doesn't have overlap of the flux provided by the effusion cells.

A typical MBE growth chamber includes a stainless steel chamber wall, a set of cryopanels, ports for pumps, a viewport, ports for other devices such as RHEED system, and etc. Several necessary sources are connected to the chamber to provide molecular flux for growth. A sample manipulator is mounted to hold the substrate to be grown.

To perform MBE epitaxial growth, a substrate is loaded to the substrate manipulator and heated up for certain surface treatment pre growth such as oxide removal. As one has a clean surface with dangling bonds, the epitaxial growth can be started on this surface. The shutter is then opened to release the evaporated molecular flux. The molecular flux reaches the substrate and forms compound on the substrate. Depending on different growth mechanisms, different growth conditions are employed to obtain good quality layers. While most commonly the III-V semiconductor material is grown on group V rich conditions means the group V element such as arsenic, phosphorus, antimony and nitrogen are continually supplied at a much higher level than the group III element such as gallium, indium and aluminum. The flux ratio varies from 5-30 for group V to group III element. The excess group V element forms an excess flux or residual pressure in the chamber. These residual molecular fluxes can be reflected by the cryopanel, but cannot fully condense on it in few minutes. To pump the chamber down to base pressure, it will typically take 10 to 30 minutes. The same situation also happens in an oxide system in which the oxygen is supplied as an excess element, and an Hg contained system where the mercury is supplied as an excess.

The present application further includes an effusion evaporator which works with the cryopanel of the system to eliminate these residual gases. A stand alone chamber with a cold panel can also be connected to the growth chamber to provide the cold surface.

The increasing of the sticking coefficient of the residual gases relies on the fact that if there is group III element, the group V element will not desorb from the surface. If we have sulfur, titanium or chromium on the surface, the Hg, nitrogen and oxygen will not desorb accordingly. The sticking of the group III element, sulfur, titanium or chromium is always good, so it will not generate additional contamination. For example, to eliminate arsenic, one can use gallium, indium or aluminum as the getter material. If gallium, indium or aluminum is evaporated to the cold surface, it will stay on the surface of the cold panel and the arsenic molecular flux impinging on the surface will stay as well. This chemical adsorption is extreme stable on cold surface. Then, the arsenic is eliminated from the free space in the chamber. The flux from the effusion evaporator doesn't comprise the flux for the growth up to 1E-5 range. In an MBE region, a BEP pressure as high as 1E-5 has a mean free path of hundreds meters, so in general the additional getter flux cannot affect the growth flux. The flux from the effusion evaporator doesn't reach the substrate because of careful geometry design, Otherwise, it provides additional growth molecular flux. Also, another effect needs to be considered such as increasing the defect density.

This pumping effect is realized by providing at least one effusion evaporator and a cold surface in the MBE system. The cold surface can be the cyropanel of the MBE system or an additional one. The effusion evaporator can work with the cyropanel or the additional panel. The two possible configurations are described here.

1. The effusion evaporator works with the cryopanel.

The effusion evaporator is mounted on the top, bottom or side of the MBE growth chamber. With carefully designed geometry, the flux provided by the evaporator can reach most of the cryopanel of the MBE growth chamber but not the substrate for growth. It is possible that the molecular flux from the evaporator goes across the path of the flux of growth element. Because the mean free path is still hundreds meters at 1e-5 torr, which is huge comparing with the size of the MBE growth chamber, the flux from different sources or the evaporator will not compromise each other.

In FIG. 1, during growth, the source (4) and other sources are supplying molecular flux to the substrate (3). The residual gas remains in the chamber (1). Then, the effusion evaporator (5) supplies getter molecular to the cryopanel (2). Since the sticking coefficient of residual gas on the getter material covered surface is 1, the impinging residual gas molecular can't desorb from the surface of the cryopanel. Thus, the excess flux or residual gas is removed from the chamber. The flux coverage of the evaporator is marked with (6). There is no overlap with the getter flux (6) and the flux for growth (7).

Figure 2:
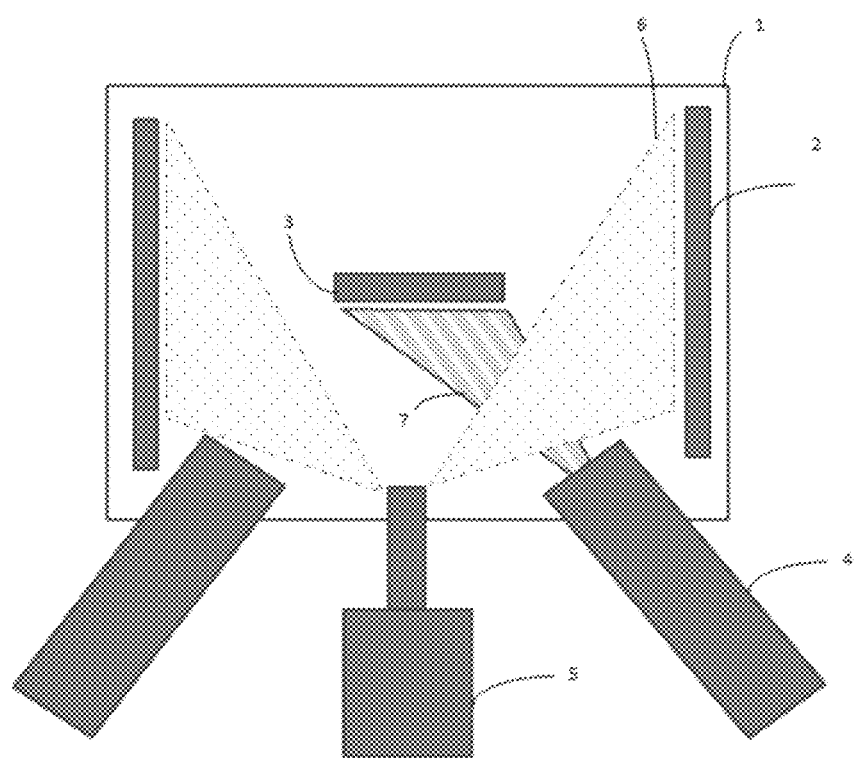
FIG. 2 is a schematic view of another setup of the present application for an MBE system where the effusion evaporator is mounted on bottom of the chamber and working with the cyropanel of the MBE growth chamber. The flux provided by the evaporator has an overlap of the flux provided by the effusion cells.

In FIG. 2, the effusion evaporator (5) supplies getter molecular to the cryopanel (2) from bottom of the chamber and then traps the excess molecular flux on the cyropanel. There is overlap with the getter flux (6) and the flux for growth (7). As explained above, this overlap doesn't compromise the growth.

2. The effusion evaporator works with the cold panel in the additional chamber which is connected to the growth chamber of MBE.

Figure 3:
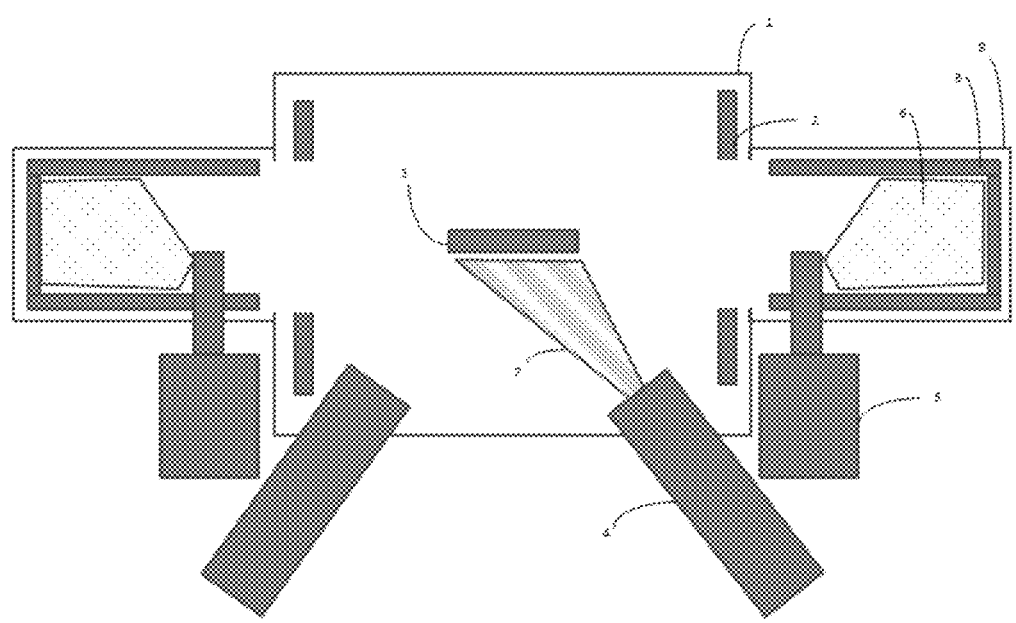
FIG. 3 is a schematic view of the third setup of the present application for MBE system where the effusion evaporator is mounted on an additional chamber attached to the MBE growth chamber and working with the cold panel in the additional chamber.

In FIG. 3, the configuration has the additional chamber (9) and the cold panel (8) connected to the MBE growth chamber. The effusion evaporator (5) is connected to the additional chamber. As with the working principle of configuration 1, the evaporator supplies getter material to the cold panel to trap the residual gas or excess flux from the growth chamber.

Comparing with the conventional MBE, this application has a remarkable low excess flux level during growth. Furthermore, the switching time of excess element is reduced.

The invention claimed is:

1. A molecular beam epitaxy system, comprising:
    a growth chamber,
    a sample manipulator mounted inside the growth chamber for holding a sample for epitaxial growth onto the sample, and
    a source for supplying a flux of a growth material to the sample,
    wherein the molecular beam epitaxy system further comprises:
    a cold panel, and
    an effusion evaporator for supplying a flux of a getter material to the cold panel;
    wherein the cold panel is mounted inside the growth chamber and the flux provided by the effusion evaporator is arranged to cross the flux provided by the source, and
    wherein the effusion evaporator is arranged to supply the getter material at a beam equivalent pressure of $1E^{-9}$ Torr to $1E^{-2}$ Torr.

2. The molecular beam epitaxy system according to claim 1, wherein the cold panel is made of stainless steel.

3. The molecular beam epitaxy system according to claim 1, wherein the effusion evaporator comprises a filament for heating and a crucible for a plurality of getter materials.

4. A method for eliminating residual gas in a molecular beam epitaxy system, wherein the method comprises:
    providing a sample manipulator mounted inside a growth chamber for holding a sample for epitaxial growth onto the sample,
    providing a source for supplying a flux of a growth material to the sample,
    providing the molecular beam epitaxy system with a cold panel and an effusion evaporator,
    cooling the cold panel, and
    supplying a flux of a getter material from the effusion evaporator to the cold panel; wherein the cold panel is mounted inside the growth chamber and the flux provided by the effusion evaporator is arranged to cross the flux provided by the source, and wherein the effusion evaporator is arranged to supply the getter material at a beam equivalent pressure of $1E^{-9}$ Torr to $1E^{-2}$ Torr.

5. The method according to claim 4, wherein the cold panel is cooled by liquid nitrogen or water.

6. The method according to claim 4, wherein the cold panel is cooled to a temperature of 290K to 2K.

7. The method according to claim 4, wherein the getter material is gallium, indium, aluminium, titanium, chromium or sulphur.

8. The method according to claim 4, wherein the residual gas comprises one or more of the followings: arsenic, phosphorus, antimony, oxygen, nitrogen, mercury, selenium and tellurium.

* * * * *